US012590994B2

(12) United States Patent
Cheng et al.

(10) Patent No.: US 12,590,994 B2
(45) Date of Patent: Mar. 31, 2026

(54) CANTILEVER PROBE CARD DEVICE AND SOLDER RECEIVING PROBE

(71) Applicant: CHUNGHWA PRECISION TEST TECH. CO., LTD., Taoyuan City (TW)

(72) Inventors: Hao-Yen Cheng, Taoyuan City (TW); Rong-Yang Lai, Taoyuan City (TW); Chao-Hui Tseng, New Taipei City (TW); Wei-Jhih Su, Taichung City (TW)

(73) Assignee: CHUNGHWA PRECISION TEST TECH. CO., LTD., Taoyuan City (TW)

( * ) Notice: Subject to any disclaimer, the term of this patent is extended or adjusted under 35 U.S.C. 154(b) by 247 days.

(21) Appl. No.: 18/632,309

(22) Filed: Apr. 11, 2024

(65) Prior Publication Data

US 2024/0385223 A1 Nov. 21, 2024

(30) Foreign Application Priority Data

May 18, 2023 (TW) .................................. 112118433

(51) Int. Cl.
| | |
|---|---|
| *G01R 1/073* | (2006.01) |
| *G01R 1/04* | (2006.01) |
| *G01R 1/067* | (2006.01) |
| *G01R 31/02* | (2006.01) |
| *G01R 31/28* | (2006.01) |

(52) U.S. Cl.
CPC ..... *G01R 1/07342* (2013.01); *G01R 1/06727* (2013.01); *G01R 31/2886* (2013.01)

(58) Field of Classification Search
CPC .......... G01R 1/04; G01R 1/067; G01R 1/073; G01R 31/00; G01R 31/02
See application file for complete search history.

(56) References Cited

U.S. PATENT DOCUMENTS

2020/0348337 A1* 11/2020 Vettori ............... G01R 1/07342

FOREIGN PATENT DOCUMENTS

JP 2005203606 * 7/2005 ............. G01R 1/073

* cited by examiner

*Primary Examiner* — Neel D Shah
(74) *Attorney, Agent, or Firm* — Li & Cai Intellectual Property Office

(57) ABSTRACT

A solder receiving probe includes an arm segment, a main segment located at one side of the arm segment, and a testing segment connected to another side of the arm segment. The main segment has a soldering end portion and an extending end portion respectively located at two opposite sides thereof along a predetermined direction. The main segment has a plurality of solder receiving holes that are arranged along a top edge of the soldering end portion and that are arranged in one row along an extending direction perpendicular to the predetermined direction. Any two of the solder receiving holes adjacent to each other are provided with one inner supporting arm therebetween. Each of the solder receiving holes can receive a solder, so that the solder does not climb across the solder receiving holes of the one row along the predetermined direction.

10 Claims, 10 Drawing Sheets

CANTILEVER PROBE CARD DEVICE AND SOLDER RECEIVING PROBE

CROSS-REFERENCE TO RELATED PATENT APPLICATION

This application claims the benefit of priority to Taiwan Patent Application No. 112118433, filed on May 18, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a cantilever probe card, and more particularly to a cantilever probe card device and a solder receiving probe.

BACKGROUND OF THE DISCLOSURE

A conventional cantilever probe card includes a substrate and a plurality of cantilever probes that are mounted on the substrate and that have substantially the same shape. Each of the cantilever probes is fixed onto the substrate through one of solders. However, the solders respectively climb the cantilever probes at different heights, respectively, making it difficult to control a stability of the soldering process.

SUMMARY OF THE DISCLOSURE

In response to the above-referenced technical inadequacies, the present disclosure provides a cantilever probe card device and a solder receiving probe for effectively improving on the issues associated with conventional cantilever probe cards.

In order to solve the above-mentioned problems, one of the technical aspects adopted by the present disclosure is to provide a cantilever probe card device, which includes a substrate, a plurality of solders, and a plurality of solder receiving probes. The substrate includes a plurality of soldering pads. The solders are respectively disposed on the soldering pads. The solder receiving probes are fixed onto the substrate, and each of the solder receiving probes includes an arm segment, a main segment located at one side of the arm segment, and a testing segment connected to another side of the arm segment. The main segment has a soldering end portion and an extending end portion respectively located at two opposite sides thereof along a predetermined direction. The main segment has a plurality of solder receiving holes penetrating therethrough. The solder receiving holes are arranged along a top edge of the soldering end portion and are arranged in one row along an extending direction perpendicular to the predetermined direction. The testing segment has an upright shape along the predetermined direction. The main segment of each of the solder receiving probes has a plurality of inner supporting arms. In each of the solder receiving probes, any one of the inner supporting arms is arranged between two of the solder receiving holes adjacent to each other, and a width of any one of the inner supporting arms along the extending direction is less than an inner diameter of any one of the solder receiving holes along the extending direction. The soldering end portions of the main segments of the solder receiving probes are respectively soldered and fixed onto the soldering pads of the substrate through the solders. In each of the solder receiving probes, each of the solder receiving holes is able to receive the corresponding solder on the soldering end portion, so that the corresponding solder does not climb across the solder receiving holes arranged in one row along the predetermined direction.

In order to solve the above-mentioned problems, another one of the technical aspects adopted by the present disclosure is to provide a solder receiving probe, which includes an arm segment, a main segment located at one side of the arm segment, and a testing segment connected to another side of the arm segment. The main segment has a soldering end portion and an extending end portion respectively located at two opposite sides thereof along a predetermined direction. The main segment has a plurality of solder receiving holes penetrating therethrough. The solder receiving holes are arranged along a top edge of the soldering end portion and are arranged in one row along an extending direction perpendicular to the predetermined direction. The testing segment has an upright shape along the predetermined direction. The main segment has a plurality of inner supporting arms. Any one of the inner supporting arms is arranged between two of the solder receiving holes adjacent to each other, and a width of any one of the inner supporting arms along the extending direction is less than an inner diameter of any one of the solder receiving holes along the extending direction. Each of the solder receiving holes is able to receive a solder, so that the solder does not climb across the solder receiving holes arranged in one row along the predetermined direction.

Therefore, in any one of the cantilever probe card device and the solder receiving probe of the present disclosure, the main segment is provided with the solder receiving holes each having a specific size (e.g., the width of the inner supporting arm is less than the inner diameter of the solder receiving hole), so that a climbing height of the solder climbing on the solder receiving probe can be precisely controlled for effectively maintaining the stability of the soldering process of the solder receiving probe.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
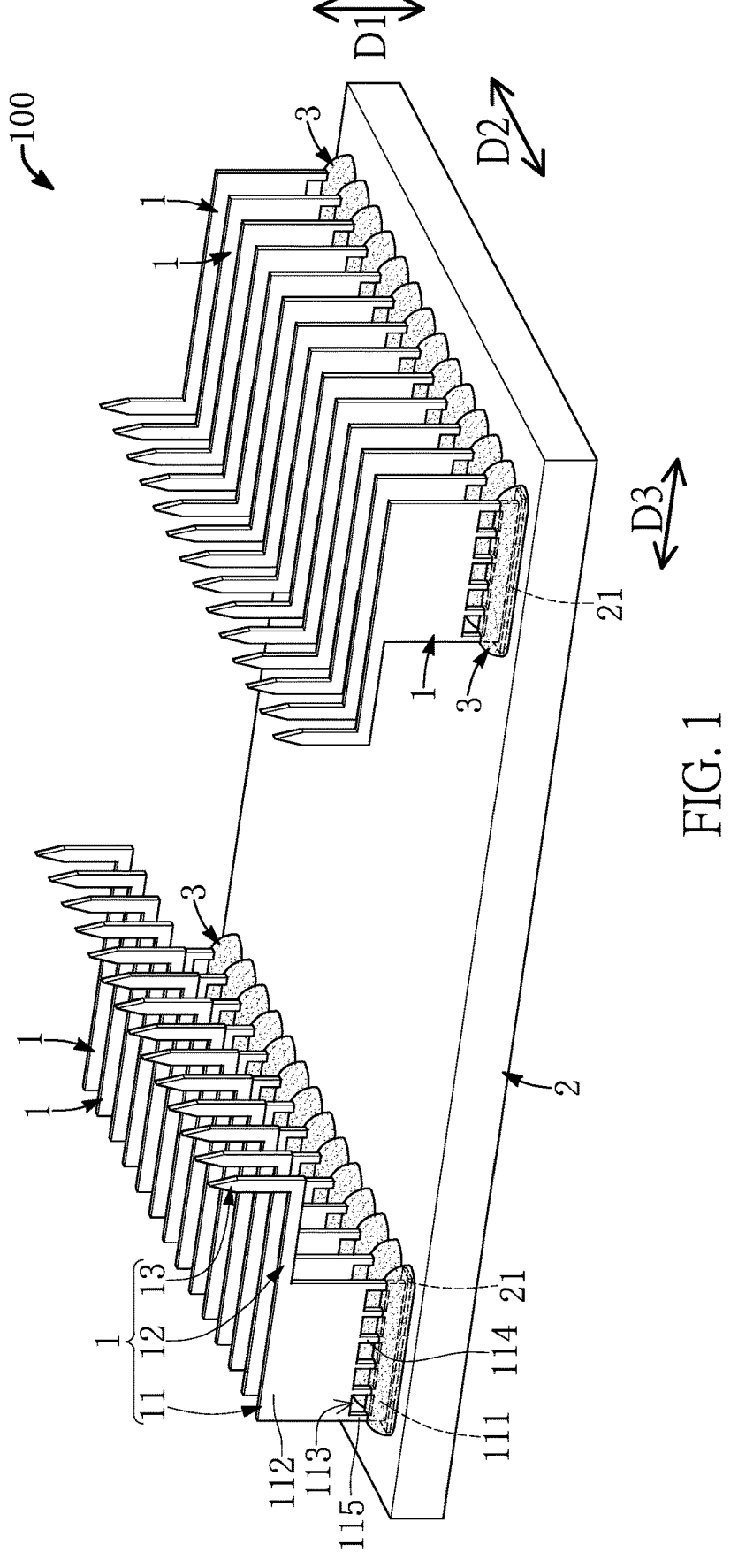
FIG. 1 is a schematic perspective view of a cantilever probe card device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides a cantilever probe card device 100, which includes a substrate 2, a plurality of solders 3, and a plurality of solder receiving probes 1 that are fixed onto the substrate 2 through the solders 3, but the present disclosure is not limited thereto. It should be noted that any probe not in a cantilever mode is different from the solder receiving probe 1 provided by the present embodiment.

In the present embodiment, the solder receiving probes 1 are arranged in two rows respectively disposed on two opposite portions of the substrate 2, but the present disclosure is not limited thereto. For example, in other embodiments of the present disclosure not shown in the drawings, the solder receiving probes 1 can be arranged in four rows disposed on a peripheral portion of the substrate 2 in an annular arrangement; or, the solder receiving probes 1 can be arranged in one row. In order to clearly describe the present embodiment, the following description discloses the structure of just one row of the solder receiving probes 1.

In addition, the solder receiving probes 1 in the present embodiment is described in cooperation with the substrate 2 and the solders 3, but the present disclosure is not limited thereto. For example, in other embodiments of the present disclosure not shown in the drawings, the solder receiving probe 1 can be independently used (e.g., sold) or can be used in cooperation with other components.

In the present embodiment, the substrate 2 is a flat board and defines a predetermined direction D1 perpendicular thereto, an arrangement direction D2 perpendicular to the predetermined direction D1, and an extending direction D3 that is perpendicular to the predetermined direction D1 and the arrangement direction D2, but the present disclosure is not limited thereto. Specifically, the substrate 2 includes a plurality of soldering pads 21 arranged in one row along the arrangement direction D2.

Each of the solder receiving probes 1 is integrally formed as a single one-piece structure. As the solder receiving probes 1 in the present embodiment are of substantially the same structure (e.g., outer contours of the solder receiving probes 1 are flush with each other along the arrangement direction D2), the following description discloses the structure of just one of the solder receiving probes 1 for the sake of brevity, but the present disclosure is not limited thereto. For example, in other embodiments of the present disclosure not shown in the drawings, the solder receiving probes 1 can be of different structures.

Figure 2:
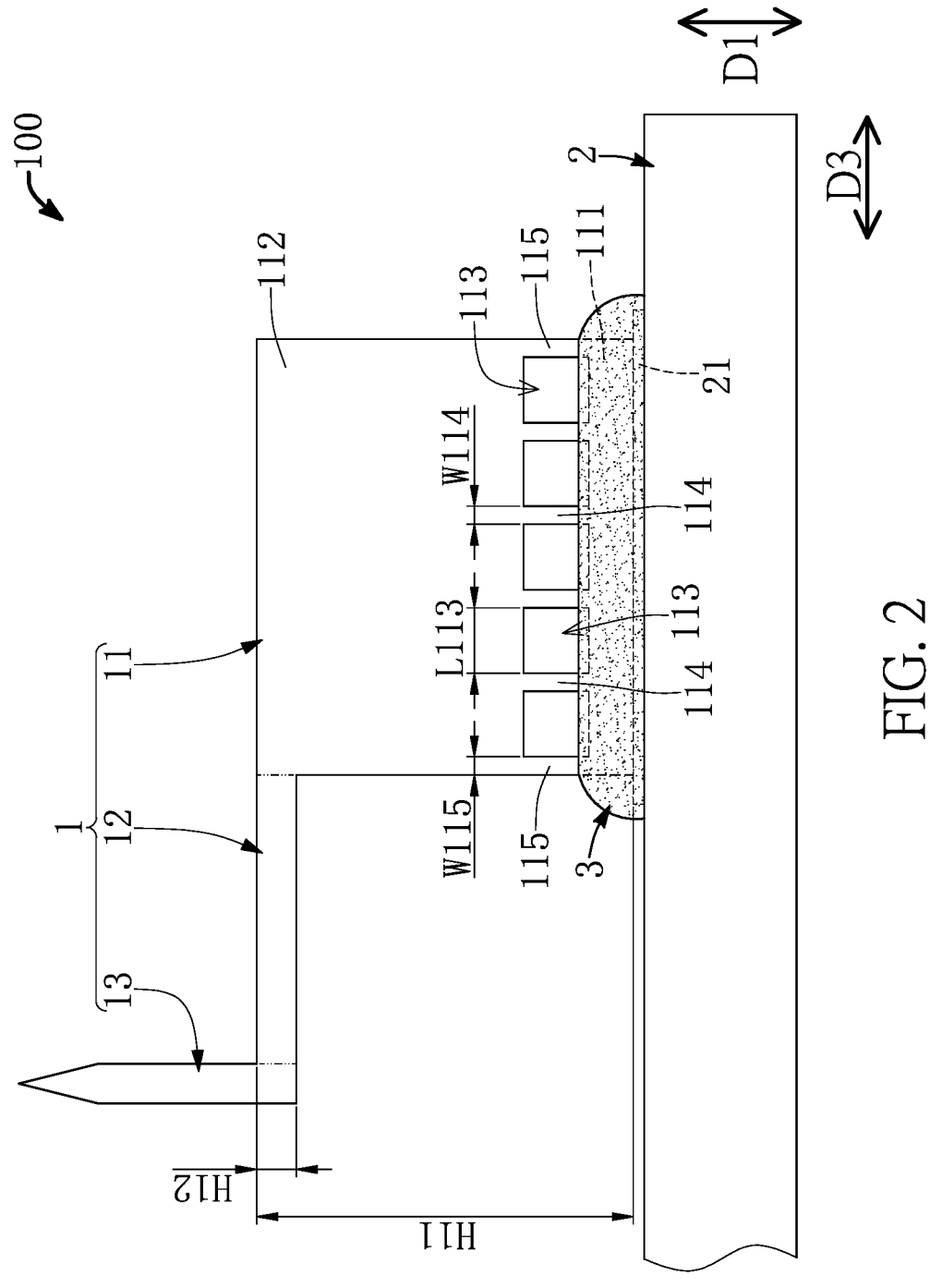
FIG. 2 is a schematic side view showing a part of FIG. 1.
Figure 3:
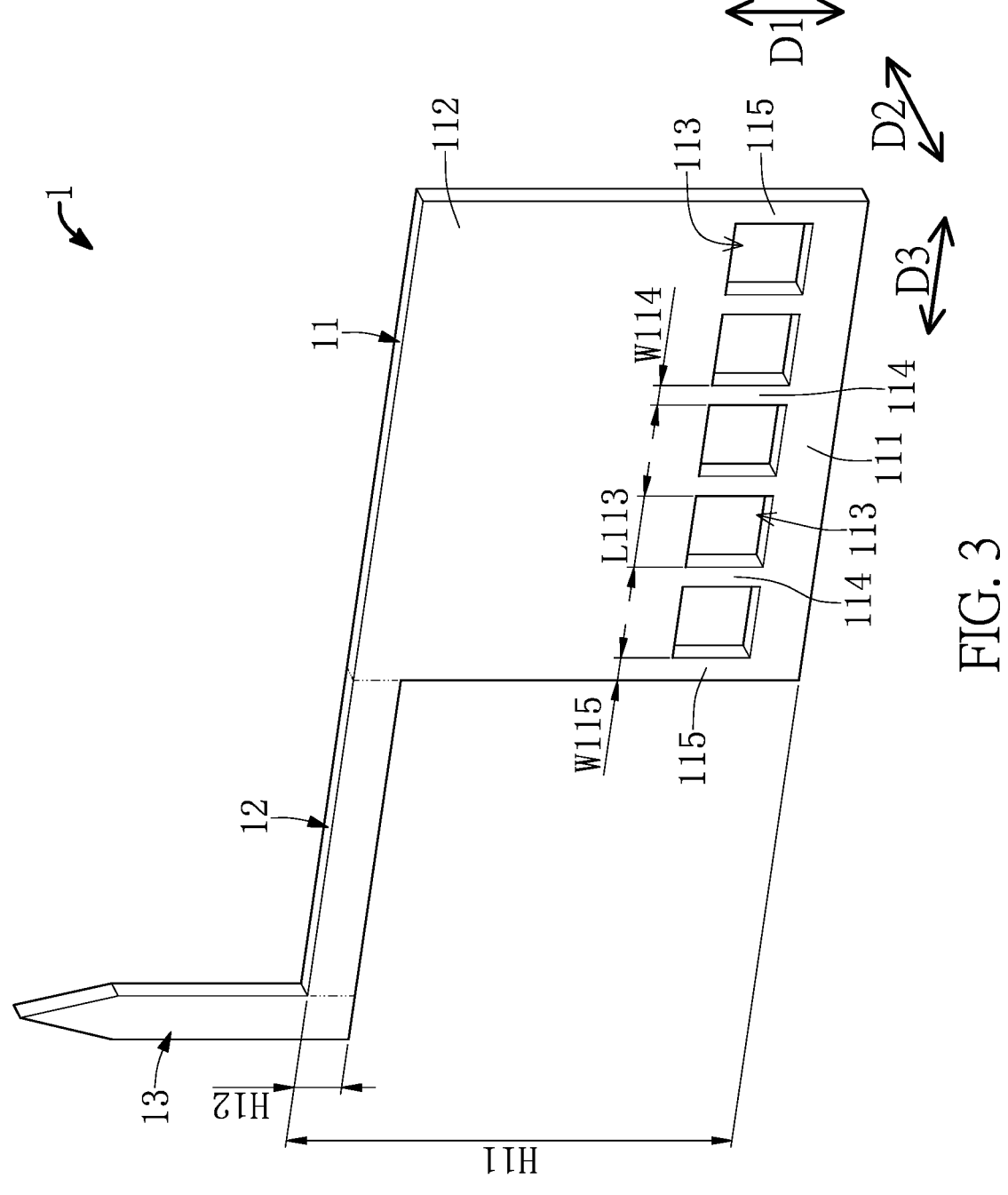
FIG. 3 is a schematic perspective view showing a solder receiving probe of FIG. 1.

As shown in FIG. 1 to FIG. 3, the solder receiving probe 1 includes a main segment 11, an arm segment 12 connected to the main segment 11, and a testing segment 13 that is connected to the arm segment 12. In other words, the main segment 11, the arm segment 12, and the testing segment 13 are sequentially connected along the extending direction D3. Specifically, the main segment 11 and the testing segment 13 are respectively connected to two opposite ends of the arm segment 12, and are respectively located at two diagonal sides of the arm segment 12.

In the present embodiment, the main segment 11 has a substantially sheet-like shape (e.g., a rectangular sheet), and the main segment 11 has a soldering end portion 111 and an extending end portion 112 respectively arranged on two opposite sides thereof along the predetermined direction D1. The arm segment 12 is an elongated structure along the extending direction D3, and one end of the arm segment 12 is connected to the extending end portion 112 of the main segment 11. The testing segment 13 has an upright shape along the predetermined direction D1 and is connected to another end of the arm segment 12.

In other words, an edge of the soldering end portion 111 is flush with an edge of the arm segment 12 so as to jointly form a straight line that is substantially perpendicular to an edge of the testing segment 13. Moreover, along the predetermined direction D1, a height H12 of the arm segment 12 is within a range from 5% to 50% of a height H11 of the main segment 11, the arm segment 12 is elastically deformable, and the main segment 11 does not have any deformation.

Specifically, the main segment 11 has a plurality of solder receiving holes 113 penetrating therethrough. The solder receiving holes 113 are not located on the soldering end portion 111. The solder receiving holes 113 are arranged along a top edge of the soldering end portion 111 and are arranged in one row along the extending direction D3. It should be noted that, apart from the solder receiving holes 113, the main segment 11 in the present embodiment has no other thru-hole.

In other words, the main segment 11 has a plurality of inner supporting arms 114 and two lateral supporting arms 115. Any one of the inner supporting arms 114 is arranged between two of the solder receiving holes 113 adjacent to each other, and the two lateral supporting arms 115 are respectively located at two opposite sides of the inner supporting arms 114 along the extending direction D3. Specifically, along the extending direction D3, a width W114 of any one of the inner supporting arms 114 is less than an inner diameter L113 of any one of the solder receiving holes 113, and a width W115 of any one of the two lateral supporting arms 115 is less than the inner diameter L113 of any one of the solder receiving holes 113.

The above description describes the structure of the solder receiving probe 1, and the following description describes connection relationship between the solder receiving probes 1 and other components. The solder receiving probes 1 are respectively fixed onto the soldering pads 21 of the substrate 2 through the soldering end portions 111 of the main segments 11. In other words, the soldering end portion 111 of any one of the solder receiving probes 1 is soldered and fixed onto one of the soldering pads 21 through one of the solders 3, and the testing segments 13 of the solder receiving probes 1 are arranged in one row along the arrangement direction D2.

In the present embodiment, the soldering manner between the soldering end portion 111 and the soldering pad 21 can be changed or adjusted according to design requirements. For example, the above soldering manner can be a surface mount technology (SMT) manner, a pin-in-paste (PIP) manner, or other soldering manners, but the present disclosure is not limited thereto. Moreover, each of the solder receiving holes 113 of the solder receiving probe 1 is able to receive the corresponding solder 3 on the soldering end portion 111, so that the corresponding solder 3 does not climb across the solder receiving holes 113 arranged in one row along the predetermined direction D1.

In summary, in the cantilever probe card device 100 (or the solder receiving probe 1) of the present embodiment, the main segment 11 is provided with the solder receiving holes 113 each having a specific size (e.g., the width W114 of the inner supporting arm 114 is less than the inner diameter L113 of the solder receiving hole 113), so that a climbing height of the solder 3 climbing on the solder receiving probe 1 can be precisely controlled for effectively maintaining the stability of the soldering process of the solder receiving probe 1.

Figure 4:
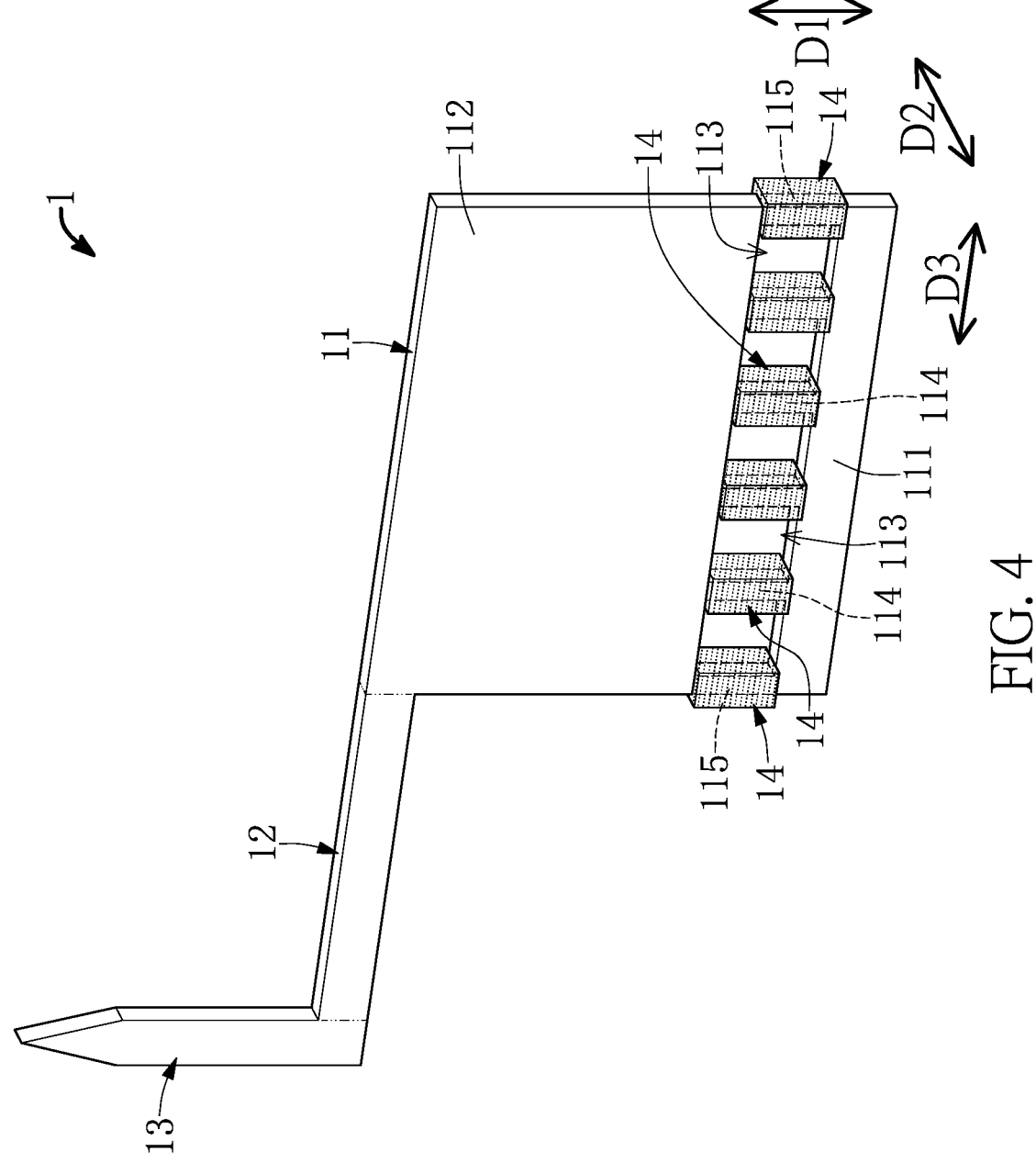
FIG. 4 is a schematic perspective view showing the solder receiving probe in another configuration according to the first embodiment of the present disclosure.

In addition, each of the solder receiving probes 1 can further include a plurality of organic insulation layers 14 (as shown in FIG. 4) that respectively cover the two lateral supporting arms 115 and the inner supporting arms 114. The organic insulation layer 14 can be made of an organic insulation material (e.g., photoresist) or other materials (e.g., metal) that can block the solder 3 from climbing thereon. The organic insulation layer 14 can be formed in any manner (e.g., a coating manner, an adhering manner, a printing manner, or a deposition manner), and the present disclosure is not limited thereto.

Second Embodiment

Referring to FIG. 5 to FIG. 8, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

Figure 5:
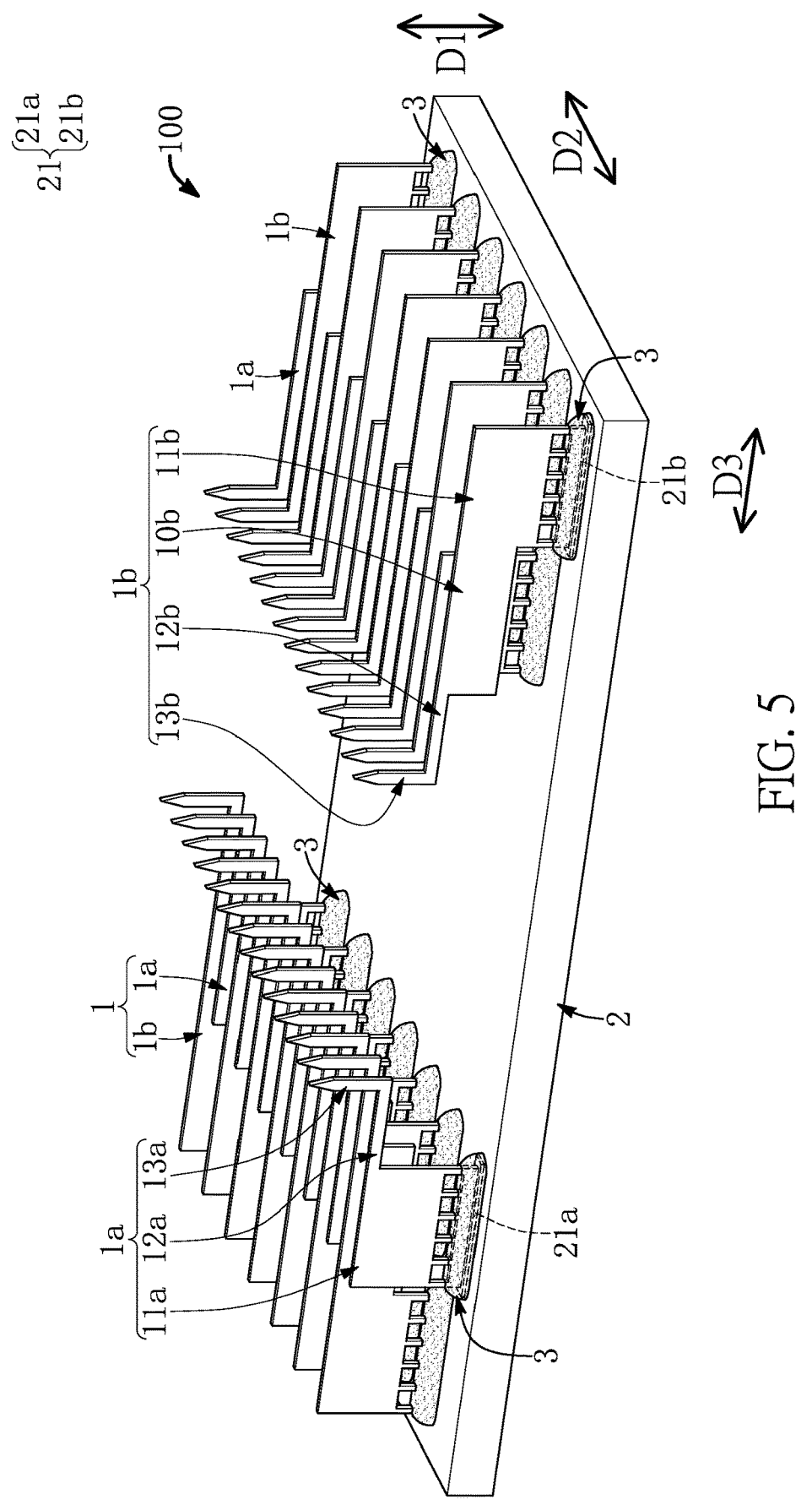
FIG. 5 is a schematic perspective view of the cantilever probe card device according to a second embodiment of the present disclosure.
Figure 6:
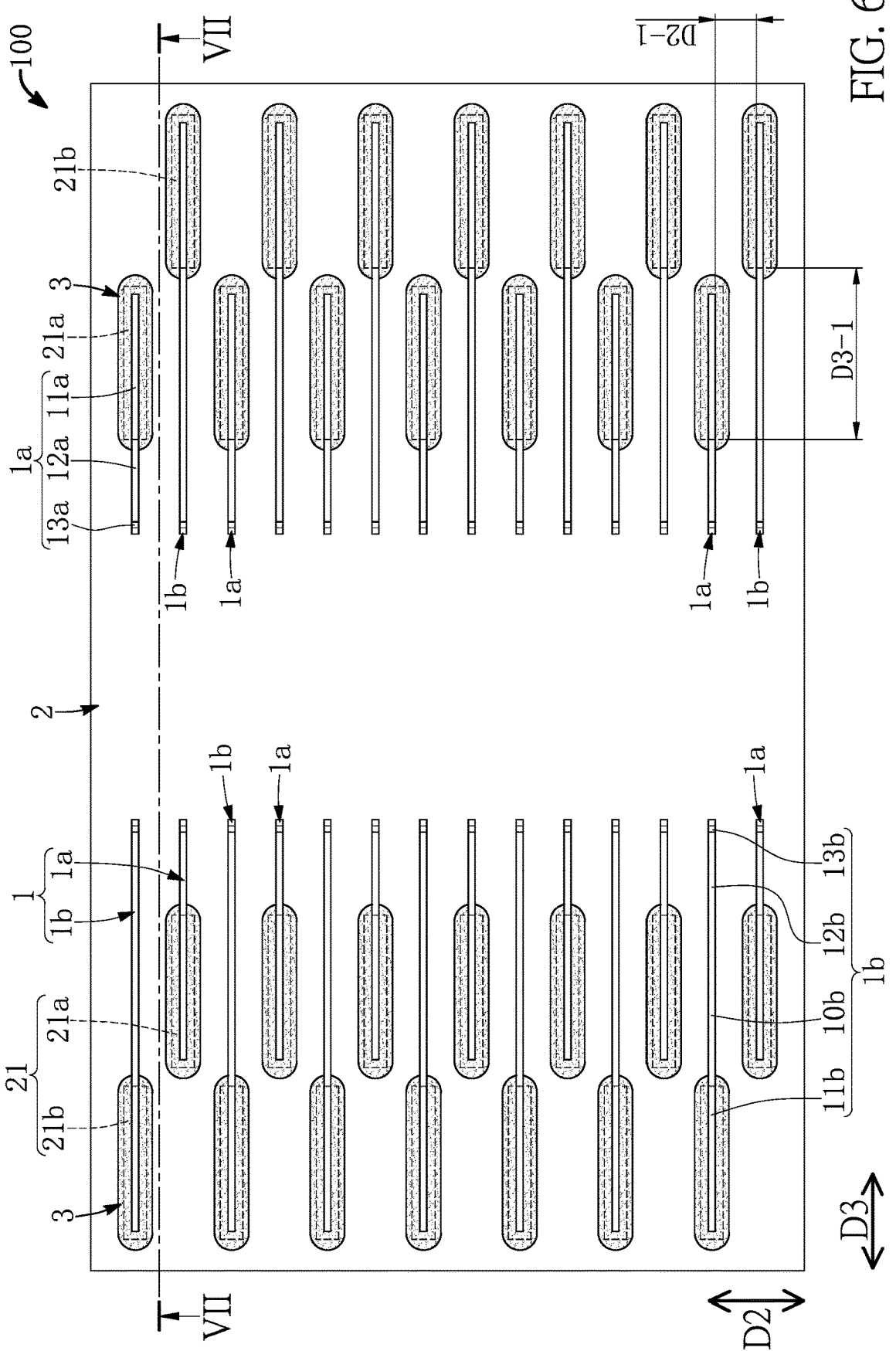
FIG. 6 is a schematic top view of FIG. 5.
Figure 7:
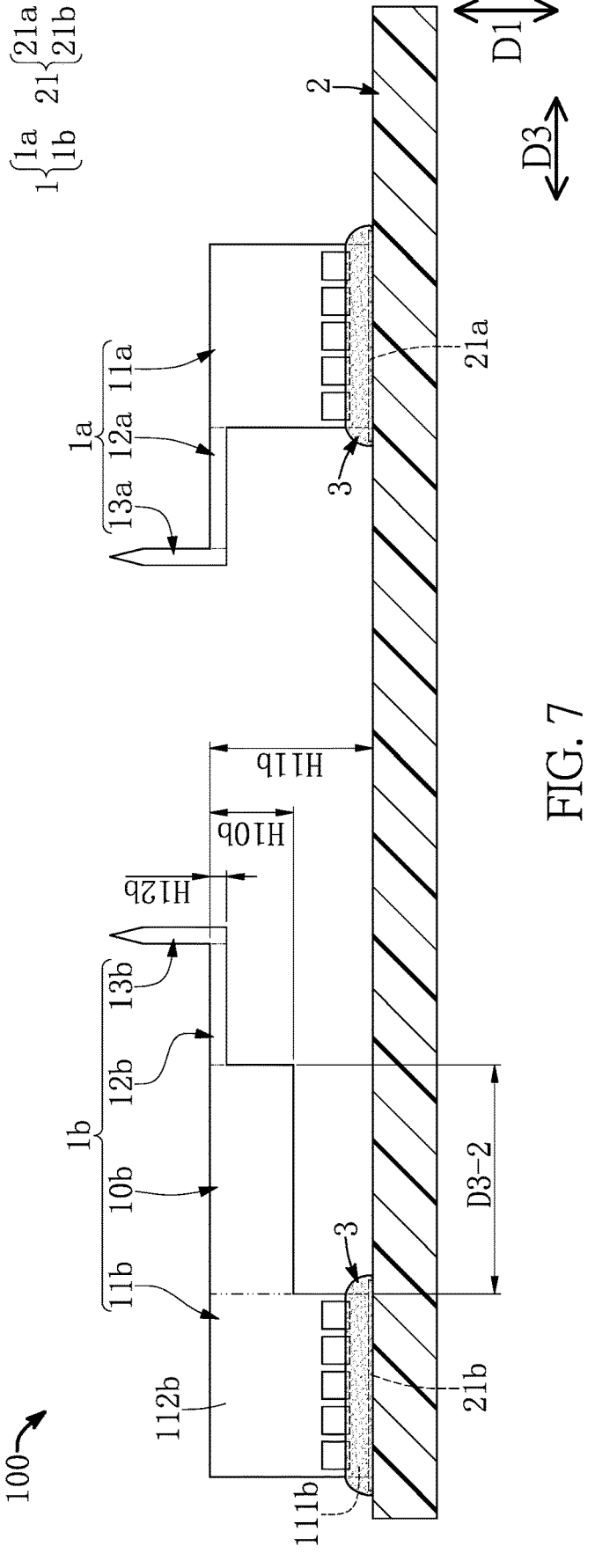
FIG. 7 is a schematic cross-sectional view taken along line VII-VII of FIG. 6.

In the present embodiment, as shown in FIG. 5 to FIG. 7, the soldering pads 21 include a plurality of first soldering pads 21a and a plurality of second pads 21b. The first soldering pads 21a are arranged in a first row along the arrangement direction D2, and the second soldering pads 21b are arranged in a second row along the arrangement direction D2. The second row is parallel to and spaced apart from the first row. The first soldering pads 21a of the first row are spaced apart from the second soldering pads 21b of the second row by an offset distance D3-1 along the extending direction D3.

The solder receiving probes 1 include a plurality of first probes 1a and a plurality of second probes 1b. The first probes 1a and the second probes 1b are staggeredly arranged with each other along the arrangement direction D2 and are fixed onto the substrate 2. In the present embodiment, any one of the first probes 1a and an adjacent one of the second probes 1b have a spacing D2-1 along the arrangement direction D2. The spacing D2-1 is within a range from 20 μm to 200 μm.

Each of the first probes 1a has the main segment 11, the arm segment 12, and the testing segment 13. The main segment 11, the arm segment 12, and the testing segment 13 of each of the first probes 1a are respectively defined as a first main segment 11a, a first arm segment 12a, and a first testing segment 13a. In other words, the structure of the first probe 1a in the present embodiment is substantially identical to that of the solder receiving probe 1 of the first embodiment.

As the second probes 1b in the present embodiment are of substantially the same structure (e.g., outer contours of the second probes 1b are flush with each other along the arrangement direction D2), the following description discloses the structure of just one of the second probes 1b for the sake of brevity, but the present disclosure is not limited thereto. For example, in other embodiments of the present disclosure not shown in the drawings, the second probes 1b can be of different structures.

The second probe 1b includes a second main segment 11b, an extending segment 10b connected to the second main segment 11b, a second arm segment 12b connected to the extending segment 10b, and a second testing segment 13b that is connected to the second arm segment 12b. In other words, the second main segment 11b, the extending segment 10b, the second arm segment 12b, and the second testing segment 13b are sequentially connected along the extending direction D3. Specifically, the extending segment 10b and the second testing segment 13b are respectively connected to two opposite ends of the second arm segment 12b, and are respectively located at two diagonal sides of the second arm segment 12b.

In other words, shapes of the first main segment 11a, the first arm segment 12a, and the first testing segment 13a of any one of the first probes 1a are respectively identical to shapes of the second main segment 11b, the second arm segment 12b, and the second testing segment 13b of any one of the second probes 1b, but the present disclosure is not limited thereto. For example, in other embodiments of the present disclosure not shown in the drawings, the shapes of the first main segment 11a, the first arm segment 12a, and the first testing segment 13a of any one of the first probes 1a can be respectively different from the shapes of the second main segment 11*b*, the second arm segment 12*b*, and the second testing segment 13*b* of any one of the second probes 1*b*.

In the present embodiment, the second main segment 11*b* has a substantially sheet-like shape (e.g., a rectangular sheet), and the second main segment 11*b* has a second soldering end portion 111*b* and a second extending end portion 112*b* respectively arranged on two opposite sides thereof along the predetermined direction D1. The extending segment 10*b* also has a substantially sheet-like shape, and one end of the extending segment 10*b* is connected to the second main segment 11*b*. The second arm segment 12*b* is an elongated structure along the extending direction D3, and one end of the second arm segment 12*b* is connected to another end of the extending segment 10*b*. The second testing segment 13*b* has an upright shape along the predetermined direction D1 and is connected to another end of the second arm segment 12*b*.

In other words, an edge of the second soldering end portion 112*b* is flush with an edge of the extending segment 10*b* and an edge of the second arm segment 12*b* so as to jointly form a straight line that is substantially perpendicular to an edge of the second testing segment 13*b*. Moreover, along the predetermined direction D1, the second main segment 11*b* has a main height H11*b*, the extending segment 10*b* has an extension height H10*b* that is within a range from 5% to 80% (e.g., 5% to 50%) of the main height H11*b*, and the second arm segment 12*b* has an arm height H12*b* that is within a range from 5% to 50% of the extension height H10*b*.

In other words, along the predetermined direction D1, the extension height H10*b* is calculated from a portion of the extending segment 10*b* connected to the second main segment 11*b*, and the arm height H12*b* is calculated from a portion of the extending segment 10*b* connected to the second arm segment 12*b*. The second arm segment 12*b* is elastically deformable, and the second main segment 11*b* and the extending segment 10*b* do not have any deformation.

Specifically, the extending segment 10*b* has an extension distance D3-2 along the extending direction D3. The extending direction D3-2 is within a range from 95% to 105% (e.g., 98% to 102%) of the offset distance D3-1. Accordingly, the second probes 1*b* can be arranged to eliminate any undesirable effects generated from the offset distance D3-1 through the extending segments 10*b*, such that the second arm segments 12*b* of the second probes 1*b* and the first arm segments 12*a* of the first probes 1*a* can have substantially the same effect.

The following description describes connection relationship among the first probes 1*a*, the second probes 1*b*, and other components. The first main segment 11*a* of any one of the first probes 1*a* is soldered and fixed onto one of the first soldering pads 21*a* through one of the solders 3, the second main segment 11*b* of any one of the second probes 1*b* is soldered and fixed onto one of the second soldering pads 21*b* through one of the solders 3, and the first testing segments 13*a* of the first probes 1*a* and the second testing segments 13*b* of the second probes 1*b* are arranged in one row along the arrangement direction D2.

Figure 8:
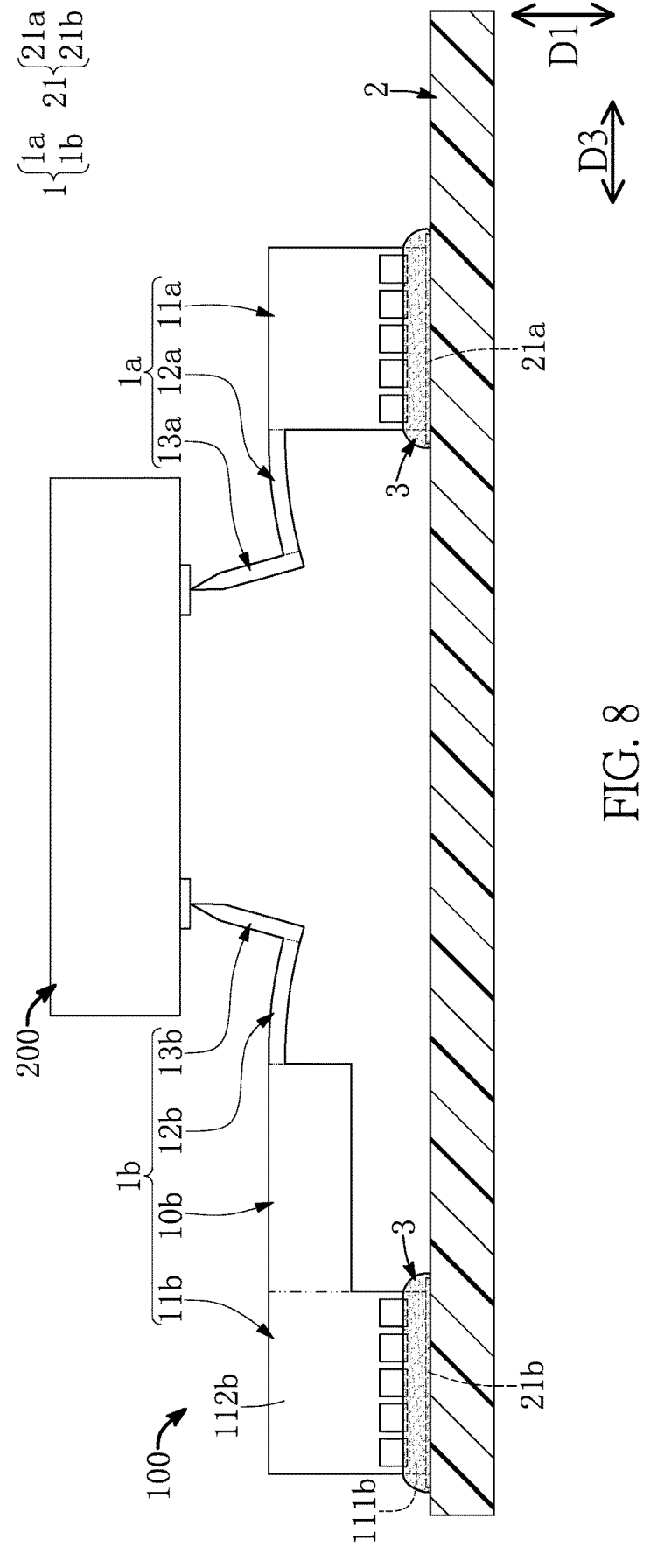
FIG. 8 is a schematic cross-sectional view showing the cantilever probe card device of FIG. 7 that abuts against a device under test (DUT)

As shown in FIG. 8, when the first testing segments 13*a* of the first probes 1*a* and the second testing segments 13*b* of the second probes 1*b* jointly abut against a device under test (DUT) 200, a pressure (or a contact force) generated in the first testing segment 13*a* of any one of the first probes 1*a* is within a range from 95% to 105% (e.g., 98% to 102%) of a pressure (or a contact force) generated in the second testing segment 13*b* of any one of the second probes 1*b*, each of the first probes 1*a* is preferably deformed only in the first arm segment 12*a*, and each of the second probes 1*b* is preferably deformed only in the second arm segment 12*b*, but the present disclosure is not limited thereto.

In summary, in the cantilever probe card device 100 of the present embodiment, each of the second probes 1*b* is provided with the extending segment 10*b* that is arranged between the second main segment 11*b* and the second arm segment 12*b* and that has a specific condition (e.g., the extension height H10*b* is within a range from 5% to 50% of the main height H11*b*), so that the second probes 1*b* and the first probes 1*a* can be in cooperation with each other for being fixed onto the second soldering pads 21*b* in the second row and the first soldering pads 21*a* in the first row, and the second probes 1*b* and the first probes 1*a* can have substantially the same pressure (or the same contact force).

Third Embodiment

Figure 9:
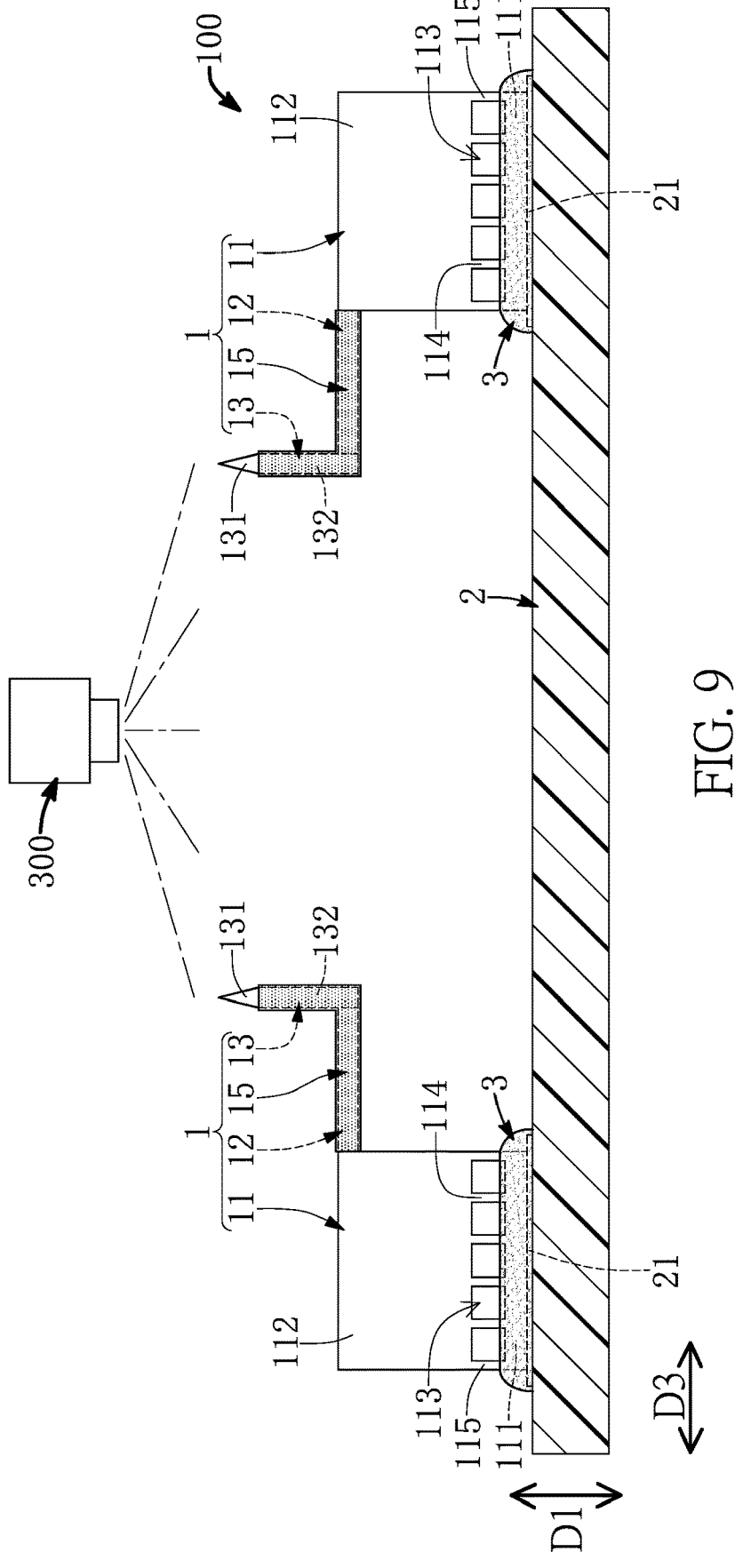
FIG. 9 is a schematic cross-sectional view of the cantilever probe card device according to a third embodiment of the present disclosure.

Referring to FIG. 9, a third embodiment of the present disclosure, which is similar to the first embodiment of the present disclosure, is provided. For the sake of brevity, descriptions of the same components in the first and third embodiments of the present disclosure will be omitted herein, and the following description only discloses different features between the first and third embodiments.

In the present embodiment, the testing segment 13 of the solder receiving probe 1 includes a pinpoint portion 131 and an upright portion 132 that connects the pinpoint portion 131 and the second arm segment 12, and the solder receiving probe 1 further includes a light absorption coating layer 15. The upright portion 132 and the second arm segment 12 are covered by (or embedded in) the light absorption coating layer 15 (i.e., the light absorption coating layer 15 covers the upright portion 132, and further extends to cover the second arm segment 12), and the pinpoint portion 131 is exposed from the light absorption coating layer 15.

Accordingly, through the light absorption coating layer 15, the testing segment 13 and the second arm segment 12 of the solder receiving probe 1 only form an observation point at the pinpoint portion 131 in an observation process of a detection apparatus 300, but the present disclosure is not limited thereto. For example, in other embodiments of the present disclosure not shown in the drawings, the light absorption coating layer 15 can only cover the upright portion 132 therein, so that the testing segment 13 only forms the observation point at the pinpoint portion 131 in the observation process of the detection apparatus 300.

Specifically, in the observation process, the detection apparatus 300 is operated by using light to irradiate on the solder receiving probes 1 for obtaining the observation point of the pinpoint portion 131 of each of the solder receiving probes 1. Moreover, a light absorption ratio of the light absorption coating layer 15 corresponding to the light is greater than or equal to 60%, and the light absorption coating layer 15 is preferably made of a polymer material, an organic material, a nano-material, or a light absorption composite material, but the present disclosure is not limited thereto.

In summary, in the cantilever probe card device 100 of the present embodiment, the solder receiving probe 1 is provided with the light absorption coating layer 15 formed on a region thereof adjacent to the pinpoint portion 131, so that the detection apparatus 300 can precisely obtain the position of the pinpoint portion 131 for facilitating the operation of the cantilever probe card device 100.

Fourth Embodiment

Figure 10:
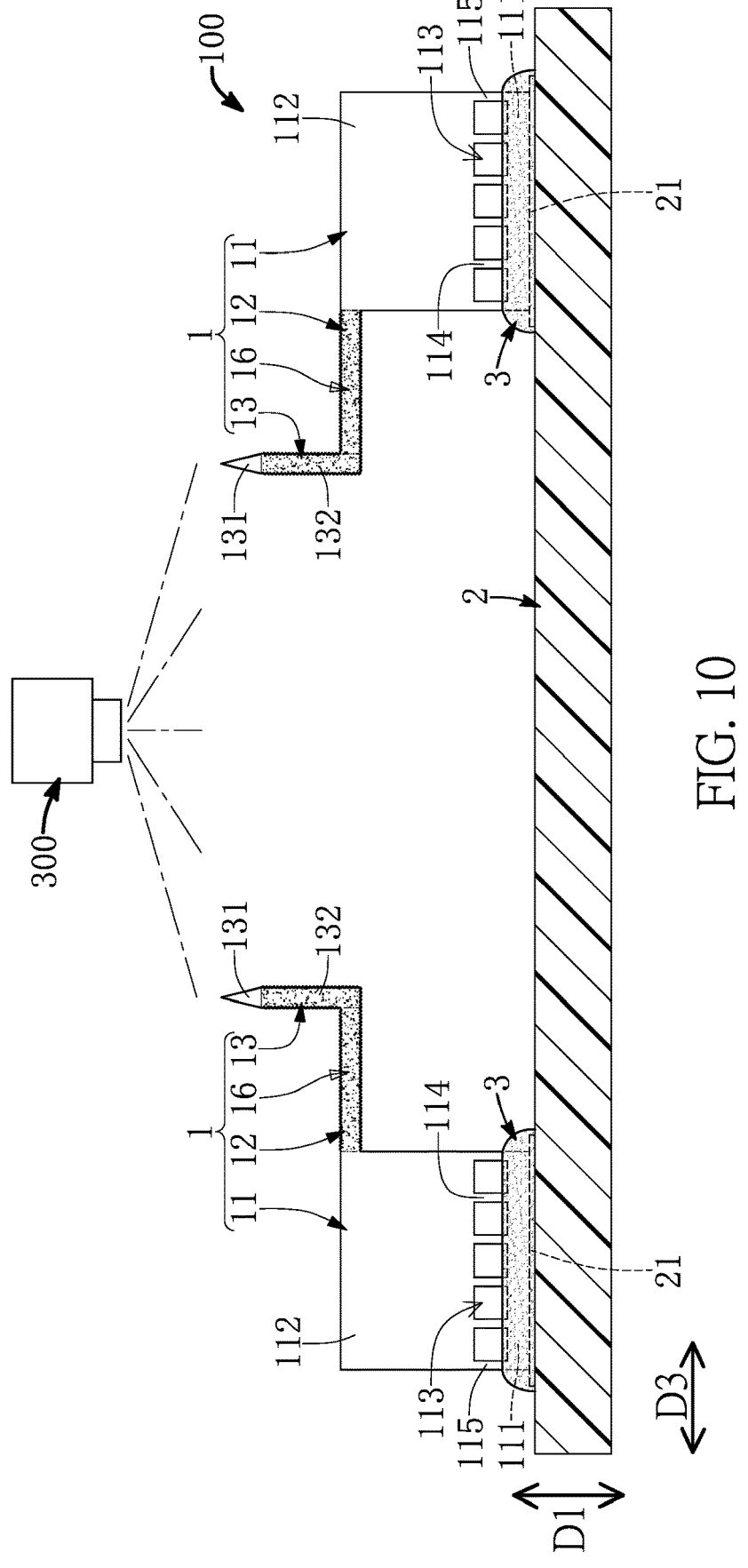
FIG. 10 is a schematic cross-sectional view of the cantilever probe card device according to a fourth embodiment of the present disclosure.

Referring to FIG. 10, a fourth embodiment of the present disclosure, which is similar to the first embodiment of the present disclosure, is provided. For the sake of brevity, descriptions of the same components in the first and fourth embodiments of the present disclosure will be omitted herein, and the following description only discloses different features between the first and fourth embodiments.

In the present embodiment, the testing segment 13 of the solder receiving probe 1 includes a pinpoint portion 131 and an upright portion 132 that connects the pinpoint portion 131 and the second arm segment 12, and the solder receiving probe 1 further has a roughened surface 16 arranged on an entirety of an outer surface of the upright portion 132. The roughened surface 16 has an arithmetic average roughness (Ra) within a range from 0.1 $\mu$m to 1 $\mu$m. In the present embodiment, the roughened surface 16 extends from the upright portion 132 to be further formed on (an entire outer surface of) the arm segment 12.

Accordingly, through the roughened surface 16, the second testing segment 13 and the second arm segment 12 of the solder receiving probe 1 only form an observation point at the pinpoint portion 131 in an observation process of a detection apparatus 300, but the present disclosure is not limited thereto. For example, in other embodiments of the present disclosure not shown in the drawings, the roughened surface 16 can be only formed on the upright portion 132, thereby only forming the observation point at the pinpoint portion 131 in the observation process of the detection apparatus 300.

Specifically, in the observation process, the detection apparatus 300 is operated by using light to irradiate on the solder receiving probes 1 for obtaining the observation point of the pinpoint portion 131 of each of the solder receiving probes 1. Moreover, the roughened surface 16 is capable of scattering the light irradiated thereon, but the present disclosure is not limited thereto.

In summary, in the cantilever probe card device 100 of the present embodiment, the solder receiving probe 1 is provided with the roughened surface 16 formed on a region thereof adjacent to the pinpoint portion 131, so that the detection apparatus 300 can precisely obtain the position of the pinpoint portion 131 for facilitating the operation of the cantilever probe card device 100.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A cantilever probe card device, comprising:
a substrate including a plurality of soldering pads;
a plurality of solders respectively disposed on the soldering pads; and
a plurality of solder receiving probes fixed onto the substrate and each including:
an arm segment;
a main segment located at one side of the arm segment, wherein the main segment has a soldering end portion and an extending end portion respectively located at two opposite sides thereof along a predetermined direction, wherein the main segment has a plurality of solder receiving holes penetrating therethrough, and wherein the solder receiving holes are arranged along a top edge of the soldering end portion and are arranged in one row along an extending direction perpendicular to the predetermined direction; and
a testing segment having an upright shape along the predetermined direction and connected to another side of the arm segment;
wherein the main segment of each of the solder receiving probes has a plurality of inner supporting arms; and wherein, in each of the solder receiving probes, any one of the inner supporting arms is arranged between two of the solder receiving holes adjacent to each other, and a width of any one of the inner supporting arms along the extending direction is less than an inner diameter of any one of the solder receiving holes along the extending direction;
wherein the soldering end portions of the main segments of the solder receiving probes are respectively soldered and fixed onto the soldering pads of the substrate through the solders; and wherein, in each of the solder receiving probes, each of the solder receiving holes is able to receive the corresponding solder on the soldering end portion, so that the corresponding solder does not climb across the solder receiving holes arranged in one row along the predetermined direction.

2. The cantilever probe card device according to claim 1, wherein each of the solder receiving probes includes two lateral supporting arms respectively located at two opposite sides of the inner supporting arms along the extending direction; and wherein, in each of the solder receiving probes, a width of any one of the two lateral supporting arms along the extending direction is less than the inner diameter of any one of the solder receiving holes.

3. The cantilever probe card device according to claim 2, wherein each of the solder receiving probes includes a plurality of organic insulation layers that respectively cover the two lateral supporting arms and the inner supporting arms.

4. The cantilever probe card device according to claim 1, wherein no other thru-holes are formed in the main segment of each of the solder receiving probes in addition to the solder receiving holes.

5. The cantilever probe card device according to claim 1, wherein the soldering pads include a plurality of first soldering pads and a plurality of second pads, wherein the first soldering pads are arranged in a first row along an arrangement direction perpendicular to the predetermined direction, and the second soldering pads are arranged in a second row along the arrangement direction, wherein the second row is parallel to and spaced apart from the first row, and wherein each of the solder receiving probes includes:
a plurality of first probes each having the main segment, the arm segment, and the testing segment, wherein the main segment, the arm segment, and the testing segment of each of the first probes are respectively defined as a first main segment, a first arm segment, and a first testing segment; and a plurality of second probes each having:

the main segment defined as a second main segment and having a main height along the predetermined direction;

an extending segment connected to the second main segment, wherein the extending segment has an extension height along the predetermined direction, and wherein the extension height is within a range from 5% to 80% of the main height;

the arm segment defined as a second arm segment and connected to the extending segment; and the testing segment defined as a second testing segment, wherein the second testing segment has an upright shape along the predetermined direction and is connected to the second arm segment;

wherein the first main segments of the first probes are fixed onto the first soldering pads, the second main segments of the second probes are fixed onto the second soldering pads, and the first testing segments of the first probes and the second testing segments of the second probes are arranged in one row along the arrangement direction;

wherein, when the first testing segments of the first probes and the second testing segments of the second probes jointly abut against a device under test (DUT), each of the first probes is only deformed in the first arm segment, and each of the second probes is only deformed in the second arm segment.

6. The cantilever probe card device according to claim 5, wherein the first soldering pads of the first row are spaced apart from the second soldering pads of the second row by an offset distance along the extending direction, and the extending segment of any one of the second probes has an extension distance along the extending direction, wherein the extension distance is within a range from 95% to 105% of the offset distance; and wherein, when the first testing segments of the first probes and the second testing segments of the second probes jointly abut against the DUT, a pressure generated in the first testing segment of any one of the first probes is within a range from 95% to 105% of a pressure generated in the second testing segment of any one of the second probes.

7. The cantilever probe card device according to claim 5, wherein any two of the second probes adjacent to each other are provided with one of the first probes therebetween, and any one of the first probes and an adjacent one of the second probes have a spacing along the arrangement direction, and wherein the spacing is within a range from 20 μm to 200 μm.

8. The cantilever probe card device according to claim 1, wherein each of the solder receiving probes includes a light absorption coating layer; wherein, in each of the solder receiving probes, the testing segment includes a pinpoint portion and an upright portion that connects the pinpoint portion and the arm segment and that is covered by the light absorption coating layer, the pinpoint portion is exposed from the light absorption coating layer, so that through the light absorption coating layer, the testing segment only forms an observation point at the pinpoint portion in an observation process of a detection apparatus; wherein, in the observation process, the detection apparatus is operated by using light to irradiate on the solder receiving probes for obtaining the observation point of each of the solder receiving probes; and wherein, in each of the solder receiving probes, a light absorption ratio of the light absorption coating layer corresponding to the light is greater than or equal to 60%.

9. The cantilever probe card device according to claim 1, wherein, in each of the solder receiving probes, the testing segment includes a pinpoint portion and an upright portion that connects the pinpoint portion and the arm segment and that has a roughened surface arranged on an entirety of an outer surface thereof, the roughened surface having an arithmetic average roughness (Ra) within a range from 0.1 μm to 1 μm, so that through the roughened surface, the testing segment only forms an observation point at the pinpoint portion in an observation process of a detection apparatus; wherein, in the observation process, the detection apparatus is operated by using light to irradiate on the solder receiving probes for obtaining the observation point of each of the solder receiving probes; and wherein, in each of the solder receiving probes, the roughened surface is capable of scattering the light irradiated thereon.

10. A solder receiving probe, comprising:

an arm segment;

a main segment located at one side of the arm segment, wherein the main segment has a soldering end portion and an extending end portion respectively located at two opposite sides thereof along a predetermined direction, wherein the main segment has a plurality of solder receiving holes penetrating therethrough, and wherein the solder receiving holes are arranged along a top edge of the soldering end portion and are arranged in one row along an extending direction perpendicular to the predetermined direction; and a testing segment having an upright shape along the predetermined direction and connected to another side of the arm segment;

wherein the main segment has a plurality of inner supporting arms, and wherein any one of the inner supporting arms is arranged between two of the solder receiving holes adjacent to each other, and a width of any one of the inner supporting arms along the extending direction is less than an inner diameter of any one of the solder receiving holes along the extending direction;

wherein each of the solder receiving holes is able to receive a solder, so that the solder does not climb across the solder receiving holes arranged in one row along the predetermined direction.

* * * * *